(12) United States Patent
Choi

(10) Patent No.: US 9,552,850 B2
(45) Date of Patent: Jan. 24, 2017

(54) SENSE AMPLIFIER DRIVING DEVICE AND SEMICONDUCTOR DEVICE INCLUDING THE SAME

(71) Applicant: SK hynix Inc., Icheon-si Gyeonggi-do (KR)

(72) Inventor: Young Geun Choi, Suwon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/886,334

(22) Filed: Oct. 19, 2015

(65) Prior Publication Data

US 2016/0372162 A1    Dec. 22, 2016

(30) Foreign Application Priority Data

Jun. 16, 2015  (KR) .................. 10-2015-0085295

(51) Int. Cl.
  *G11C 7/08*   (2006.01)
  *G11C 7/06*   (2006.01)
  *G11C 7/12*   (2006.01)
(52) U.S. Cl.
  CPC ............. *G11C 7/062* (2013.01); *G11C 7/08* (2013.01); *G11C 7/12* (2013.01)
(58) Field of Classification Search
  CPC ...................................... G11C 7/08
  USPC ................ 365/189.14, 194, 203, 207
  See application file for complete search history.

(56) References Cited

U.S. PATENT DOCUMENTS

| 8,189,406 B2 | 5/2012 | Chang et al. |
| 2007/0076501 A1* | 4/2007 | Kang ............... G11C 7/02 365/208 |
| 2015/0046723 A1 | 2/2015 | Park et al. |

* cited by examiner

*Primary Examiner* — Hoai V Ho
*Assistant Examiner* — Jay Radke
(74) *Attorney, Agent, or Firm* — William Park & Associates Ltd.

(57) ABSTRACT

An embodiment relates to a sense amplifier driving device for stabilizing bit line precharge power when a post-overdriving operation is performed. The sense amplifier driving device includes a power driving unit configured to supply a first pull-up voltage and a pull-down voltage to a pull-up power line and a pull-down power line during a post-overdriving period and a driving signal generation unit configured to generate a pull-up driving signal and a pull-down driving signal activated during the post-overdriving period in order to control the driving of the power driving unit. The driving signal generation unit controls a point of time at which the pull-down driving signal shifts in response to a post-overdriving enable signal.

18 Claims, 6 Drawing Sheets

SENSE AMPLIFIER DRIVING DEVICE AND SEMICONDUCTOR DEVICE INCLUDING THE SAME

CROSS-REFERENCE TO RELATED APPLICATION

The present application claims priority under 35 U.S.C. §119(a) to Korean application number 10-2015-0085295 filed on Jun. 16, 2015, in the Korean Intellectual Property Office, which is incorporated herein by reference in its entirety.

BACKGROUND

1. Technical Field

Various embodiments generally relate to an integrated circuit, and more particularly to a sense amplifier driving device for stabilizing a bit line precharge power when a post-overdriving operation is performed.

2. Related Art

Demands for high-speed, highly integrated semiconductor memory devices are leading to advances in synchronous memory devices. The synchronous memory device has an interface that is synchronized with the system bus.

A single data rate (hereinafter referred to as "SDR") synchronous memory device transfers only one data bit per clock cycle of the system bus. The SDR synchronous memory device transfers a data bit on either the rising edge or the falling edge of the clock.

However, the SDR synchronous memory device is still insufficient to satisfy speed requirements of a system. A double data rate ("DDR") synchronous memory device is faster than the SDR synchronous memory device. The DDR synchronous memory device transfers data bits on both the rising and falling edges of the clock signal.

Each of the data input/output pins of the DDR synchronous memory device continuously inputs and outputs two data in synchronization with the rising edge and falling edge of an external clock (e.g. system clock). Accordingly, without increasing clock frequency, the DDR synchronous memory device can input/output data at higher speed than the SDR synchronous memory device because the bandwidth of the DDR synchronous memory device is at least twice the bandwidth of the SDR synchronous memory device.

Dynamic random access memory ("DRAM") is a volatile memory device. A memory cell of DRAM includes a cell transistor and a cell capacitor.

The cell transistor functions to transfer electrical charges from the cell capacitor to a bit line, and the cell capacitor stores electrical charges corresponding to data. That is, each data bit may have a high voltage level or a low voltage level depending on the amount of charges stored in the cell capacitor.

A memory cell of DRAM requires a refresh operation, which is the process of periodically reading data from the memory cell and immediately rewriting the read data to the same memory cell.

A memory cell of DRAM is activated in an active mode. A sense amplifier, which is used when data is read from the memory cell, may sense a small voltage level of a data bit, which is read from a memory cell through a bit line, and amplify the small voltage level to recognizable logic levels so the data can be interpreted properly. The bit line sense amplifier circuit may also write back the amplified data on the memory cell.

Furthermore, in a precharge mode, a memory cell is deactivated, and the memory cell retains data. The refresh operation may include an active operation and a precharge operation, which are repeatedly performed in a specific cycle.

When a refresh operation is performed, a post-overdriving operation may be performed to reduce an electric current that will be consumed in the next sensing operation. When a post-overdriving operation mode ends, the level of a bit line precharge voltage rises. In this case, when a precharge operation is performed after the activation operation, it may be difficult for the sense amplifier to sense a high-voltage data bit.

SUMMARY

Various embodiments are directed to stabilizing bit line precharge power when a post-overdriving operation is performed.

In an embodiment, a sense amplifier driving device includes a power driving unit configured to supply a first pull-up voltage and a pull-down voltage to a pull-up power line and a pull-down power line during a post-overdriving period and a driving signal generation unit configured to generate a pull-up driving signal and a pull-down driving signal activated during the post-overdriving period in order to control the driving of the power driving unit, wherein the driving signal generation unit controls a point of time at which the pull-down driving signal shifts in response to a post-overdriving enable signal.

In an embodiment, a semiconductor device includes a sense amplifier configured to sense and amplify the data of a memory cell in response to a voltage applied to a pull-up power line and a pull-down power line and a sense amplifier driving device configured to supply a first pull-up voltage and a pull-down voltage to the pull-up power line and the pull-down power line during a post-overdriving period, generate a pull-up driving signal and a pull-down driving signal for controlling the first pull-up voltage and the pull-down voltage, and control a point of time at which the pull-down driving signal shifts in response to a post-overdriving enable signal.

DETAILED DESCRIPTION

Hereinafter, a sense amplifier driving device and a semiconductor device including a sense amplifier driving device will be described below with reference to the accompanying drawings through various examples of embodiments.

Figure 1:
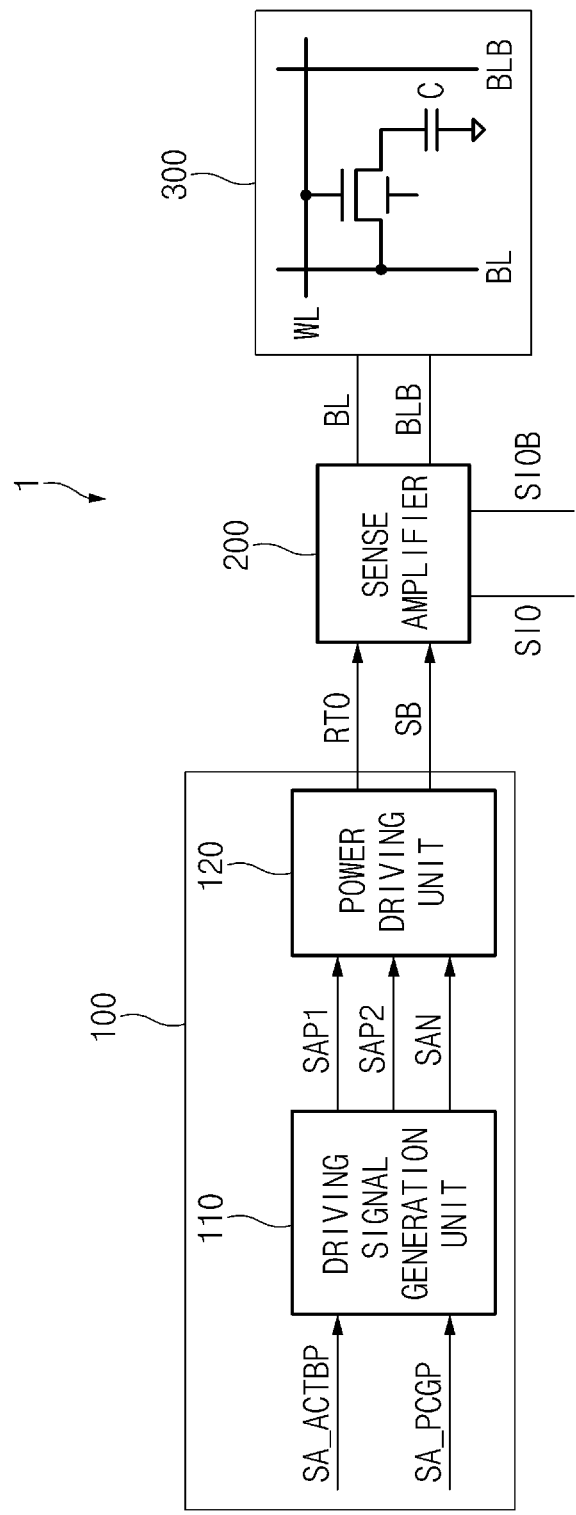
FIG. 1 is a diagram showing the configuration of a semiconductor device according to an embodiment.

FIG. 1 is a diagram showing the configuration of a semiconductor device according to an embodiment.

Data bits stored in the semiconductor device 1 according to an embodiment may have a high level H or a low level L in accordance with a voltage level. The high and low levels H and L may also be represented by "1" and "0." In this case, a data value is different depending on a voltage level and the amount of an electric current. In the case of binary data, a high level is defined as a high voltage, and a low level is defined as a voltage lower than the high level.

Referring to FIG. 1, the semiconductor device 1 may include a sense amplifier driving device 100, a sense amplifier 200, and a memory cell 300. The sense amplifier driving device 100 may include a driving signal generation unit 110 and a power driving unit 120.

In an embodiment, the driving signal generation unit 110 generates pull-up driving signals SAP1 and SAP2 and a pull-down driving signal SAN in response to an active signal SA_ACTBP and a precharge signal SA_PCGP. The pull-up driving signals SAP1 and SAP2 and the pull-down driving signal SAN are activated during a predetermined period in response to the active signal SA_ACTBP and the precharge signal SA_PCGP.

Furthermore, the active signal SA_ACTBP is activated after a predetermined time from a point of time at which an active command is applied. The precharge signal SA_PCGP is activated after a predetermined time from a point of time at which a precharge command is applied.

In an embodiment, the driving signal generation unit 110 controls a point of time at which the pull-down driving signal SAN transitions between the high and low levels H and L depending on whether or not a post-overdriving operation is performed. That is, in the period in which a post-overdriving operation is performed, the driving signal generation unit 110 delays a falling edge at which the pull-down driving signal SAN is deactivated. If the period in which the pull-down driving signal SAN is deactivated is increased, the time taken for applying a ground voltage VSS to a pull-down power line SB increases.

The post-overdriving operation is an operation for storing, prior to the application of a precharge command, a high voltage level in a cell storage node before a word line WL is disabled by raising the voltage of the pull-up power line RTO of the sense amplifier 200 to the level of the power supply voltage VDD higher than a core voltage VCORE.

Accordingly, the voltage level of a bit line pair BL and BLB can be prevented from rising because the post-overdriving operation may drop the level of a bit line precharge voltage VBLP, which has had an increased voltage level.

In an embodiment, if a post-overdriving operation is not performed, the pull-down driving signal SAN is not delayed, and the pull-down driving signal SAN is deactivated when semiconductor device 1 enters a precharge period. Accordingly, if a post-overdriving operation is not performed, the level of the bit line precharge voltage VBLP is controlled to prevent an unnecessary voltage drop.

The power driving unit 120 supplies power to the pull-up power line RTO and the pull-down power line SB coupled to the sense amplifier 200 in response to the pull-up driving signals SAP1 and SAP2 and the pull-down driving signal SAN.

The power driving unit 120 drives the pull-up power line RTO to a first pull-up voltage (e.g., the power supply voltage VDD) or a second pull-up voltage (e.g., the core voltage VCORE) in response to the pull-up driving signals SAP1 and SAP2. Furthermore, the power driving unit 120 drives the pull-down power line SB to a first pull-down voltage (e.g., the ground voltage VSS) in response to the pull-down driving signal SAN. Furthermore, the power driving unit 120 precharges the pull-up power line RTO and the pull-down power line SB with the bit line precharge voltage VBLP in response to a precharge signal BLEQ.

The sense amplifier 200 operates by using a driving power applied to the pull-up power line RTO and the pull-down power line SB. The sense amplifier 200 senses data read from the memory cell 300 through the bit line pair BL and BLB, amplifies the sensed data, and outputs the amplified data to sensing lines SIO and SIOB.

In the active mode, the sense amplifier driving device 100 configured as described above supplies the pull-up power line RTO with the core voltage VCORE and supplies the pull-down power line SB with the ground voltage VSS. In contrast, in an overdriving mode, the sense amplifier driving device 100 supplies the pull-up power line RTO with the power supply voltage VDD having a higher voltage level than the core voltage VCORE. In an embodiment, the sense amplifier driving device 100 may supply the pull-up power line RTO with the power supply voltage VDD during a predetermined initial period in the active mode.

In the precharge mode, after the memory cell 300 is deactivated, the sense amplifier driving device 100 supplies the bit line precharge voltage VBLP to the pull-up power line RTO and the pull-down power line SB. Furthermore, the memory cell 300 is deactivated and retains data, and the bit line pair BL and BLB is precharged with the level of the bit line precharge voltage VBLP.

The semiconductor device 1 according to an embodiment performs an overdriving operation in a development period of the bit line pair BL and BLB in order to reduce RAS to CAS Delay time ("tRCD"). Furthermore, in the semiconductor device 1 according to an embodiment, the sense amplifier driving device 100 performs a post-overdriving operation during a certain period of time before the word line W is deactivated (e.g., when the memory cell 300 is deactivated).

For example, it is assumed that a data "1" has been stored in the memory cell 300 and the sense amplifier 200 amplifies the data "1" and transfers the amplified data to the memory cell 300. In this situation, the memory cell 300 receives data amplified with the power supply voltage VDD, which is higher than the core voltage VCORE, until the memory cell 300 is deactivated. Accordingly, a data retention time, during which the memory cell 300 can retain its data bit after it is deactivated, may increase.

In a write period, the memory cell 300 is activated, and data are transferred to the bit line pair BL and BLB through the sensing lines SIO and SIOB. The sense amplifier 200 senses the data, amplifies the sensed data, and transfers the amplified data to the memory cell 300.

For example, it is assumed that a data "1" is transferred to the memory cell 300. In this case, the sense amplifier 200 transfers, to the memory cell 300, the data amplified with the core voltage VCORE.

Thereafter, in the precharge mode, the memory cell 300 receives the data amplified with the power supply voltage VDD, which is higher than the core voltage VCORE, until the memory cell 300 is deactivated. Accordingly, a time tWR taken to apply a precharge command after a point of time at which a write command is applied can be reduced. The data retention time, during which the memory cell 300 can retain its data bit after it is deactivated, may increase.

The activation of the memory cell 300 means that the cell transistor T is turned on in response to a control voltage transferred through the word line WL and thus the cell capacitor C and a primary bit line BL are electrically coupled to each other. The deactivation of the memory cell 300 means that the cell transistor T is turned off.

The semiconductor device 1 enters a corresponding operation mode in response to an active command, a precharge command, or a write command. The semiconductor device 1 substantially enters a corresponding operation mode after a predetermined time from a point of time at which a corresponding command signal is applied.

Furthermore, the semiconductor device 1 performs a write operation or read operation in response to a write command or read command, which are applied between an active command and a precharge command.

Figure 2:
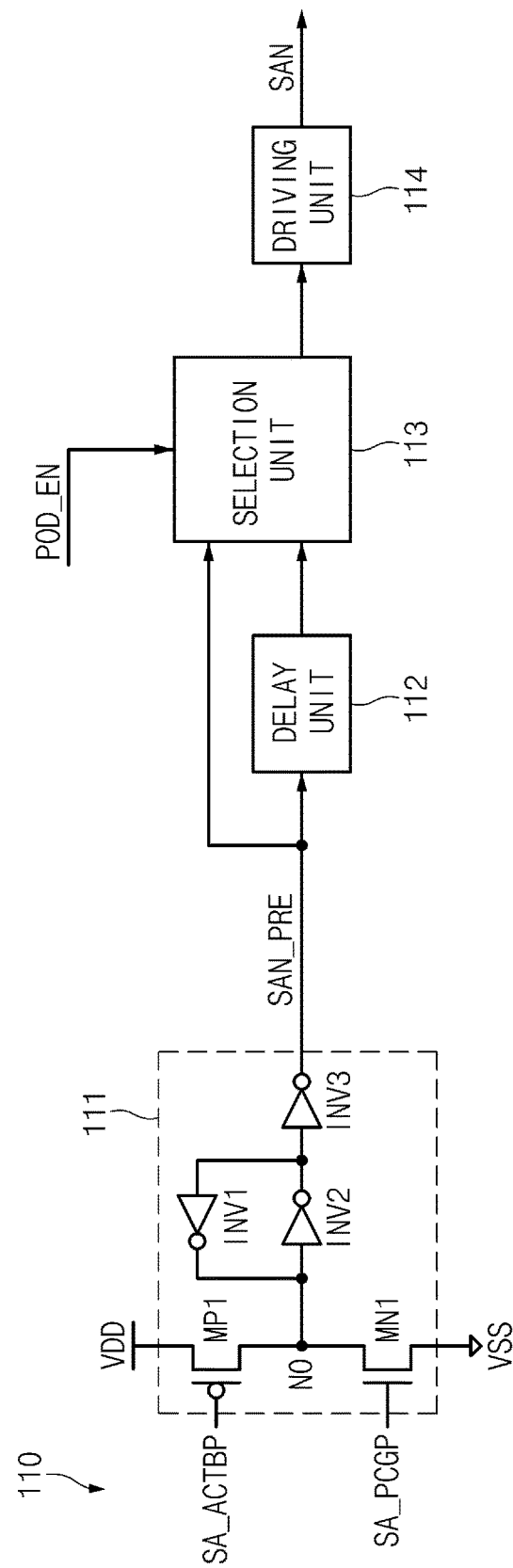
FIG. 2 is a detailed circuit diagram of a driving signal generation unit shown in FIG. 1.

FIG. 2 is a detailed circuit diagram of the driving signal generation unit 110 shown in FIG. 1.

In the embodiment of FIG. 2, only a circuit configuration for generating the pull-down driving signal SAN is described, and a circuit configuration for generating the pull-up driving signals SAP1 and SAP2 is omitted.

The driving signal generation unit 110 may include a control signal generation unit 111, a delay unit 112, a selection unit 113, and a driving unit 114. The control signal generation unit 111 performs pull-up or pull-down driving on a pull-down pre-signal SAN_PRE in response to the active signal SA_ACTBP and the precharge signal SA_PCGP. The precharge signal SA_PCGP is a signal that shifts to a high level after a predetermined time from a point of time at which a precharge command is applied.

The control signal generation unit 111 may include a PMOS transistor MP1, an NMOS transistor MN1, and a plurality of inverters INV1, INV2, INV3. The PMOS transistor MP1 and the NMOS transistor MN1 are coupled in series between a terminal for applying the power supply voltage VDD and a terminal for applying the ground voltage VSS. The active signal SA_ACTBP is applied to the gate terminal of the PMOS transistor MP1, and the precharge signal SA_PCGP is applied to the gate terminal of the NMOS transistor MN1.

The inverters INV1 and INV2, which forms a latch structure, store a signal of a node NO and output an inverted signal. Furthermore, the inverter INV3 outputs the pull-down pre-signal SAN_PRE by inverting the output of the inverter INV2.

The delay unit 112 delays the pull-down pre-signal SAN_PRE and outputs the delayed signal. The delay unit 112 may delay the pull-down pre-signal SAN_PRE such that, in a precharge period, only the falling edge of the pull-down pre-signal SAN_PRE is delayed. That is, the delay unit 112 has a delay time for controlling a point of time at which the pull-down driving signal SAN is activated to a low level.

The selection unit 113 selects one of the pull-down pre-signal SAN_PRE and selects output of the delay unit 112 in response to a post-overdriving enable signal POD_EN. The driving unit 114 outputs the pull-down driving signal SAN by amplifying output of the selection unit 113.

For example, when the post-overdriving enable signal POD_EN is activated, the selection unit 113 selects output of the delay unit 112. In contrast, when the post-overdriving enable signal POD_EN is deactivated, the selection unit 113 selects the pull-down pre-signal SAN_PRE.

Figure 3:
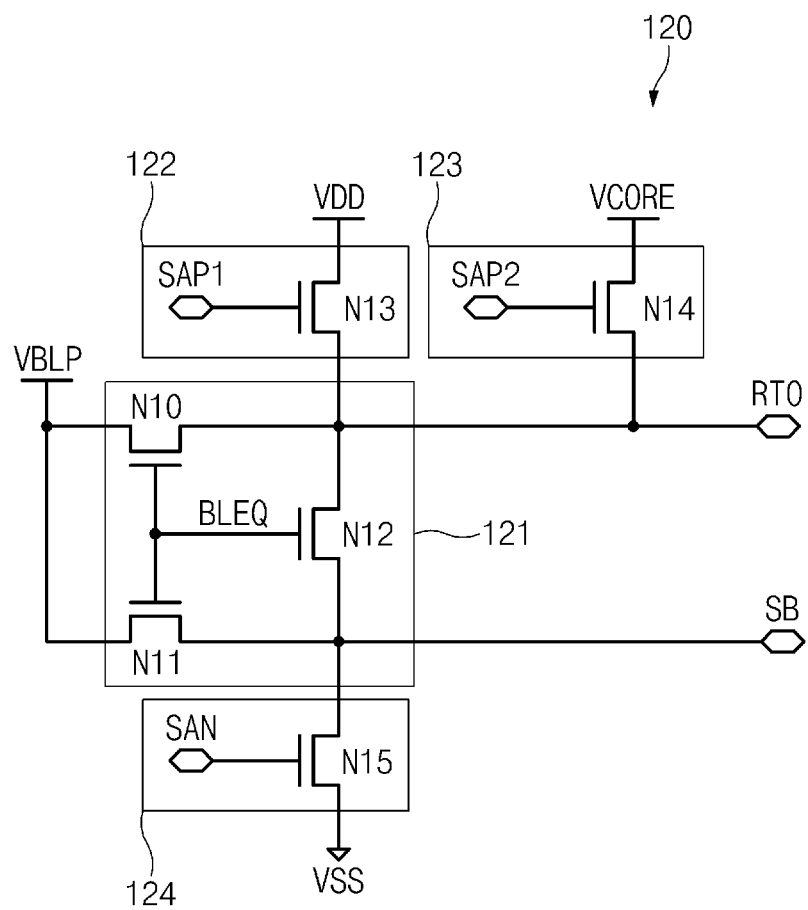
FIG. 3 is a detailed circuit diagram of a power driving unit shown in FIG. 1.

FIG. 3 is a detailed circuit diagram of the power driving unit 120 shown in FIG. 1.

The power driving unit 120 may include a precharge driving unit 121, pull-up driving units 122 and 123, and a pull-down driving unit 124.

In the percharge mode, the precharge driving unit 121 supplies the bit line precharge voltage VBLP to the pull-up power line RTO and the pull-down power line SB in response to the precharge signal BLEQ. The precharge driving unit 121 may include a plurality of NMOS transistors N10, N11, N12 gate terminals of which are coupled to each other.

The NMOS transistor N10 is coupled between a terminal for applying the bit line precharge voltage VBLP and the pull-up power line RTO. The NMOS transistor N11 is coupled between the terminal for applying the bit line precharge voltage VBLP and the pull-down power line SB. The NMOS transistor N12 is coupled between the pull-up power line RTO and the pull-down power line SB.

When the pull-up driving signal SAP1 is activated during an overdriving period, the pull-up driving unit 122 supplies the pull-up power line RTO with an overdriving voltage (e.g., the power supply voltage VDD). The pull-up driving unit 122 may include an NMOS transistor N13. The NMOS transistor N13 is coupled between the terminal for applying the power supply voltage VDD and the pull-up power line RTO. The pull-up driving signal SAP1 is applied to the gate terminal of the NMOS transistor N13.

When the pull-up driving signal SAP2 is activated during an active period, the pull-up driving unit 123 supplies the core voltage VCORE to the pull-up power line RTO. The pull-up driving unit 123 may include an NMOS transistor N14 coupled between the terminal for applying the core voltage VCORE and the pull-up power line RTO. The pull-up driving signal SAP2 is applied to the gate terminal of the NMOS transistor N14.

When the pull-down driving signal SAN is activated, the pull-down driving unit 124 supplies the ground voltage VSS to the pull-down power line SB. The pull-down driving unit 124 includes an NMOS transistor N15. The NMOS transistor N15 is coupled between the terminal for applying the ground voltage VSS and the pull-down power line SB. The pull-down driving signal SAN is applied to the gate terminal of the NMOS transistor N15.

Figure 4:
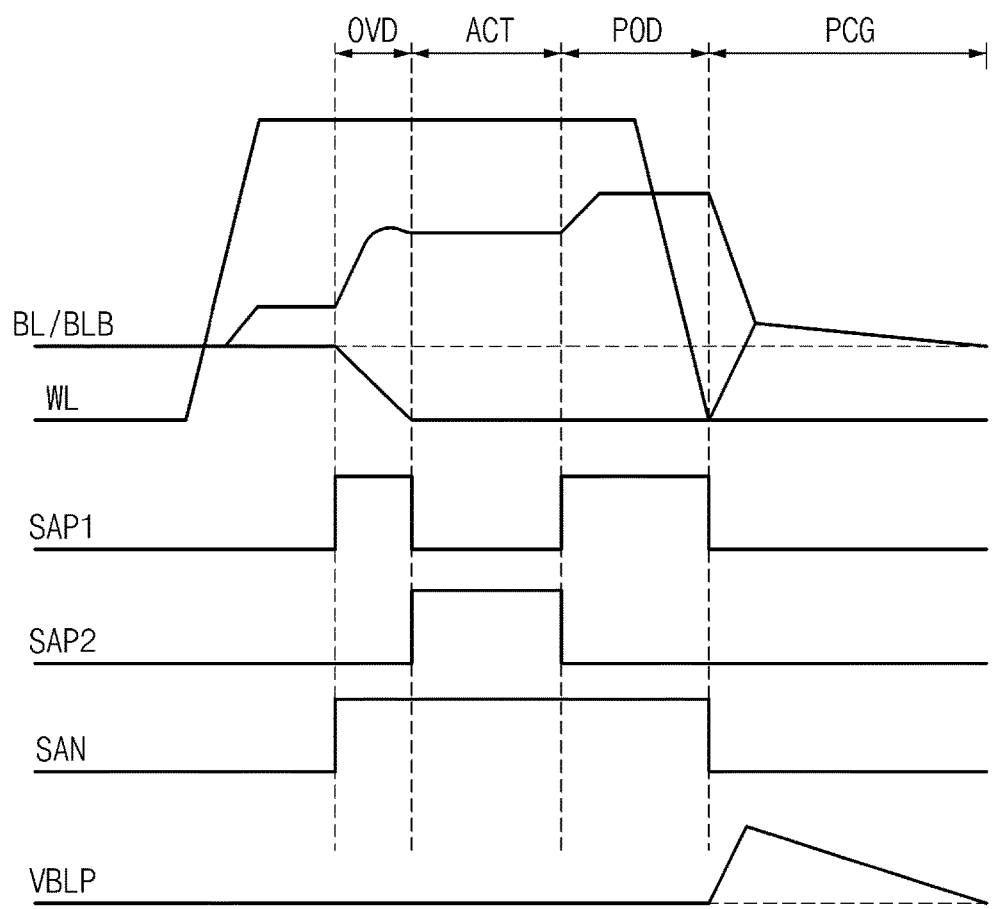
FIGS. 4 to 6 are operation timing diagrams illustrating an operation of the sense amplifier driving device according to an embodiment.
Figure 5:
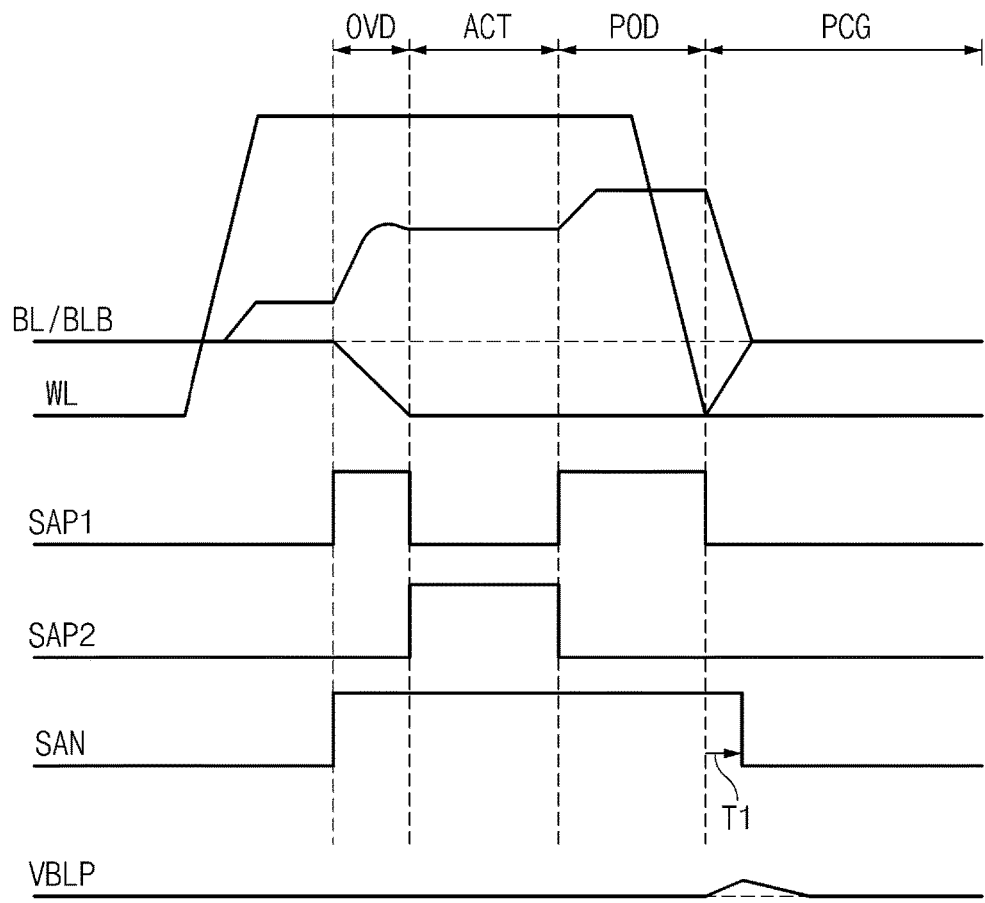
Figure 6:
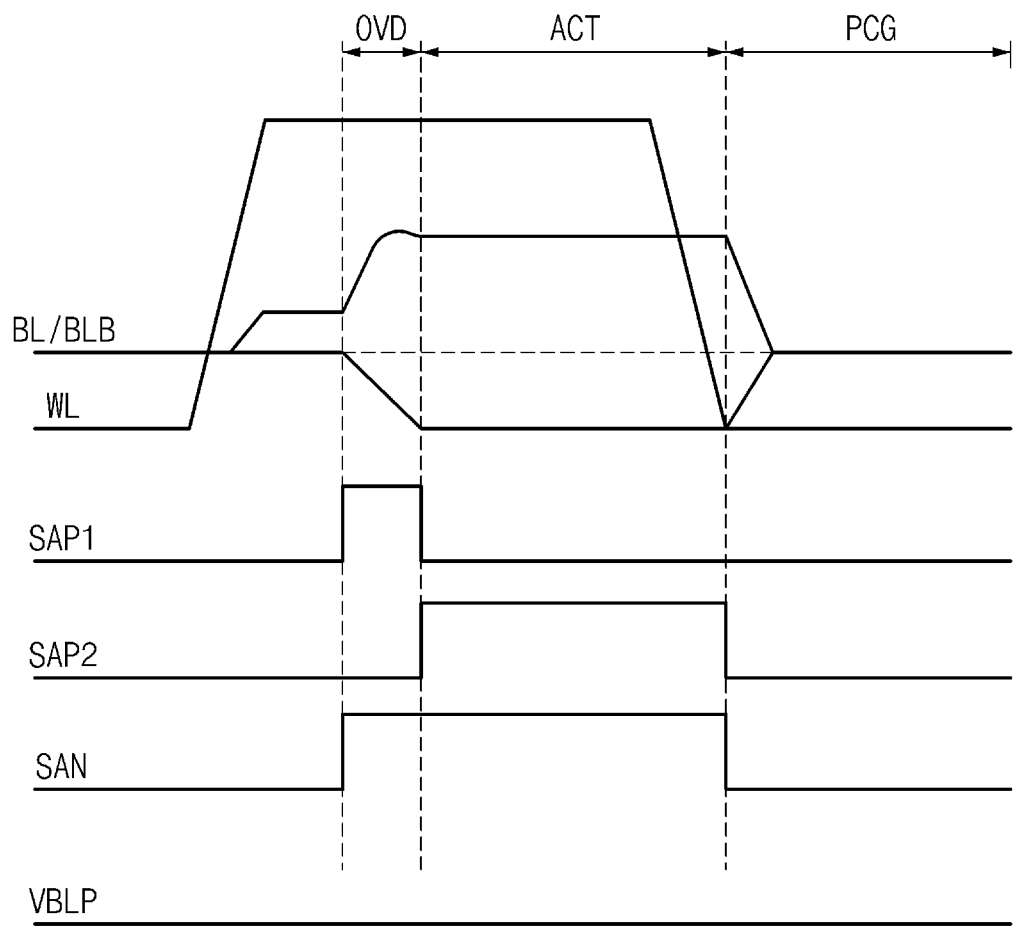

FIGS. 4 to 6 are operation timing diagrams illustrating an operation of the sense amplifier driving device 100 according to an embodiment.

First, in the active period in which the precharge signal BLEQ has a low level, the transistors of the precharge driving unit 121 are turned off. Accordingly, the bit line precharge voltage VBLP is not supplied to the pull-up power line RTO and the pull-down power line SB.

At a point of time at which the word line WL is activated and the bit line pair BL and BLB is developed after an active command is applied, the sense amplifier driving device 100 enters an overdriving period OVD. In the overdriving period OVD, each of the pull-down driving signal SAN and the pull-up driving signal SAP1 transitions to a high level, and the pull-up driving signal SAP2 remains at a low level.

That is, when the pull-up driving signal SAP1 has a high level, the NMOS transistor N13 of the pull-up driving unit 122 is turned on. Accordingly, the pull-up power line RTO is over-driven to the level of the power supply voltage VDD. Furthermore, when the pull-down driving signal SAN has a high level, the NMOS transistor N15 of the pull-down driving unit 124 is turned on. Accordingly, the pull-down power line SB is driven to the level of the ground voltage VSS.

In this case, in the overdriving period OVD, the pull-up driving unit 123 maintains turned off because the pull-up driving signal SAP2 is at a low level.

In an active operation period ACT which comes after the overdriving period OVD, the pull-up driving signal SAP1 shifts to a low level, and the pull-up driving unit 122 is turned off. Furthermore, the pull-up driving signal SAP2 shifts to a high level, and the pull-up driving unit 123 is turned on. Accordingly, in the active operation period ACT, the pull-up power line RTO is driven to the level of the core voltage VCORE.

That is, when an active command ACTIVE CMD is applied, charges are shared between the memory cell 300 and the primary bit line BL because the memory cell 300 is activated. Assuming that a data "0" has been stored, the voltage level of the primary bit line BL drops.

Next, the sense amplifier 200 senses whether or not there is a voltage difference ΔV between the bit line pair BL and BLB, and amplifies the voltage difference ΔV during the overdriving period OVD. For example, if there is a voltage difference ΔV between the bit line pair BL and BLB, the sense amplifier 200 drives the bit line pair BL and BLB to the level of the power supply voltage VDD and the ground voltage VSS, respectively. As a result, an overdriving voltage (e.g., the power supply voltage VDD) may reduce a time tRCD that is taken for a write command WRITE CMD to be applied from a point of time at which the active command is applied.

When a write command WRITE CMD is applied and the data to be written is "1", the data "1" is transferred to the bit line pair BL and BLB. The sense amplifier 200 drives the primary bit line BL with the core voltage VCORE, and drives the secondary bit line BLB with the ground voltage VSS.

The word line WL is activated before the precharge signal BLEQ shifts to a high level. Furthermore, when the precharge signal BLEQ shifts to a high level in a precharge period PCG, the word line WL is disabled.

That is, a certain period of time before the word line WL is disabled and prior to the precharge period PCG is a post-overdriving period POD. In the post-overdriving period POD, the pull-down driving signal SAN maintains a high level, the pull-up driving signal SAP1 shifts to a high level again, and the pull-up driving signal SAP2 shifts to a low level.

When the pull-up driving signal SAP1 shifts to a high level, the NMOS transistor N13 of the pull-up driving unit 122 is turned on. Accordingly, the pull-up power line RTO is over-driven to the level of the power supply voltage VDD. Furthermore, when the pull-down driving signal SAN has a high level, the NMOS transistor N15 of the pull-down driving unit 124 is turned on. Accordingly, the pull-down power line SB is driven to the level of the ground voltage VSS.

In the post-overdriving period POD, the pull-up driving unit 123 maintains turned off because the pull-up driving signal SAP1 has a high level and the pull-up driving signal SAP2 has a low level.

As described above, the voltage level of the pull-up power line RTO may rise during the post-overdriving period POD and is precharged with the level of the bit line precharge voltage VBLP when the semiconductor device 1 is in the precharge period PCG.

During the post-overdriving period POD, however, the power supply voltage VDD having a high voltage level has been applied to the pull-up power line RTO. Accordingly, when the semiconductor device 1 is in the precharge period PCG as in FIG. 4, the bit line precharge voltage VBLP may excessively rise, and thus a voltage applied to the bit line pair BL and BLB may also rise.

If active and precharge commands are frequently applied, the bit line precharge voltage VBLP of a device in which a post-overdriving operation is performed slightly rises. That is, a target level of the bit line precharge voltage VBLP is the core voltage VCORE/2, whereas the bit line BL has the core voltage VCORE+alpha and the bit line bar BLB has 0 V. In such a case, the sensing margin of a data "1" at the sense amplifier 200 may decrease.

Accordingly, in an embodiment, during the active period ACT, the active signal SA_ACTBP is activated to a low level. Accordingly, the PMOS transistor MP1 is turned on, and the pull-down pre-signal SAN_PRE is activated to a high level.

In contrast, when the precharge period PCG starts, the precharge signal SA_PCGP becomes a high level, and thus the pull-down pre-signal SAN_PRE shifts to a low level. The delay unit 112 delays a point of time at which the pull-down pre-signal SAN_PRE shifts to a low level.

In the post-overdriving period POD in which the post-overdriving operation is performed, the post-overdriving enable signal POD_EN is activated. Accordingly, when the post-overdriving enable signal POD_EN is activated, the selection unit 113 selects output of the delay unit 112. Accordingly, as shown in FIG. 5, the pull-down driving signal SAN is delayed by a delay time T1 of the delay unit 112 and shifts to a low level.

If the level of the bit line precharge voltage VBLP has been excessively increased in the post-overdriving period POD as described above, the level of the bit line precharge voltage VBLP is lowered by delaying a point of time at which the pull-down driving signal SAN is inactivated so that pull-down driving is performed on the bit line precharge voltage VBLP.

In order to prevent the level of the bit line precharge voltage VBLP from rising, when a bit line precharge operation is performed, the raised level of the bit line precharge voltage VBLP can be lowered by activating the pull-down driving signal SAN for a longer time.

In order to prevent the level of the bit line precharge voltage VBLP from rising, when a bit line precharge operation is performed, the raised level of the bit line precharge voltage VBLP can be lowered by activating the pull-down driving signal SAN for a long time.

If a post-overdriving operation mode is not used in a specific state, however, the level of the bit line precharge voltage VBLP may be excessively lowered if the pull-down driving signal SAN is activated for a long time in order to lower the bit line precharge voltage VBLP.

Accordingly, when the post-overdriving enable signal POD_EN is deactivated, the selection unit 113 according to an embodiment selects the pull-down pre-signal SAN_PRE so that the pull-down driving signal SAN shifts to a low level without delay. If a post-overdriving operation is not performed, the level of the bit line precharge voltage VBLP does not rise.

In such a case, as shown in FIG. 6, the pull-down driving signal SAN shifts to a low level prior to the precharge period PCG, and the bit line pair BL and BLB is normally precharged with the level of the bit line precharge voltage VBLP.

Thereafter, when the semiconductor device 1 is in the precharge period PCG in which the precharge signal BLEQ shifts to a high level, all the NMOS transistor N10, N11, N12 of the precharge driving unit 121 are turned on. Accordingly, the pull-up power line RTO and the pull-down power line SB are precharged with the bit line precharge voltage VBLP.

For reference, a point of time at which the precharge signal BLEQ, that is, a control signal for precharging the primary bit line BL and the secondary bit line BLB and precharging the pull-up power line RTO and the pull-down power line SB, is activated may be controlled by considering a point of time at which the memory cell 300 is deactivated, that is, a point of time at which the word line WL is deactivated.

As described above, the semiconductor device according to an embodiment transfers data to the memory cell 300 with a driving voltage corresponding to the data. In the precharge mode, the semiconductor device may transfer data to the memory cell 300 amplified with an overdriving voltage having a higher or lower voltage level than a driving voltage until a point of time at which the memory cell 300 is deactivated.

That is, in the active mode, the sense amplifier 200 senses and amplifies the read data of the memory cell 300 received through the bit line pair BL and BLB and transfers, to the memory cell 300, the data amplified with a driving voltage corresponding to the read data. Furthermore, in the precharge mode, the sense amplifier 200 transfers, to the memory cell 300, data amplified with an overdriving voltage having a higher or lower voltage level than a driving voltage until a point of time at which the memory cell 300 is deactivated, thereby increasing a data retention time.

Furthermore, when writing data, the sense amplifier 200 transfers, to the memory cell 300, data amplified with a driving voltage corresponding to data. Furthermore, in the precharge mode, the sense amplifier 200 transfers, to the memory cell 300, data amplified with an overdriving voltage having a voltage level higher or lower than a driving voltage until a point of time at which the memory cell 300 is deactivated. Accordingly, the time taken for data to be transferred to the memory cell 300 and a data retention time can be improved.

As described above, a detailed description has been given according to an embodiment. For reference, an embodiment including an additional element may be illustrated in order to describe an embodiment in more detail although the additional element is not directly related to the technical scope of the embodiment. Furthermore, the active high or active low configurations for indicating the activation state of the signal and circuit may be different according to an embodiment.

Furthermore, in order to implement the same function, the configurations of the transistors may be changed, if necessary. That is, the configurations of the PMOS transistor and the NMOS transistor may be mutually replaced and may be implemented using various transistors, if necessary. Furthermore, in order to implement the same function, the configuration of a logic gate may be changed, if necessary. Such a change of the circuit has a large number of cases and may be easily inferred by those skilled in the art, and the enumeration thereof is omitted.

As described above, there is an advantage in that the deterioration of the offset of data sensed by the bit line sense amplifier can be prevented because the level of a bit line precharge voltage is stabilized when the on/off operation of post-overdriving mode is performed.

While various embodiments have been described above, it will be understood to those skilled in the art that the embodiments described are by way of example only. Accordingly, the sense amplifier driving device and the semiconductor device including the same described herein should not be limited based on the described embodiments.

What is claimed is:

1. A sense amplifier driving device, comprising:
   a power driving unit configured to supply a first pull-up voltage and a pull-down voltage to a pull-up power line and a pull-down power line during a post-overdriving period; and
   a driving signal generation unit configured to generate a pull-up driving signal and a pull-down driving signal activated during the post-overdriving period in order to control a driving of the power driving unit, wherein the driving signal generation unit controls a point of time at which the pull-down driving signal shifts in response to a post-overdriving enable signal,
   wherein the driving signal generation unit comprises:
   a control signal generation unit configured to perform pull-up or pull-down driving on a pull-down pre-signal in response to an active signal and a precharge signal;
   a delay unit configured to delay the pull-down pre-signal;
   a selection unit configured to select one of the pull-down pre-signal and an output of the delay unit in response to the post-overdriving enable signal; and
   a driving unit configured to output the pull-down driving signal by driving the output of the selection unit.

2. The sense amplifier driving device of claim 1, wherein the post-overdriving period is a certain period of time before a word line of a memory cell is disabled prior to a precharge period.

3. The sense amplifier driving device of claim 1, wherein the first pull-up voltage comprises a power supply voltage.

4. The sense amplifier driving device of claim 1, wherein the pull-down voltage comprises a ground voltage.

5. The sense amplifier driving device of claim 1, wherein the power driving unit supplies, during an active period, the pull-up power line with a second pull-up voltage lower than the first pull-up voltage.

6. The sense amplifier driving device of claim 5, wherein the second pull-up voltage comprises a core voltage.

7. The sense amplifier driving device of claim 1, wherein the power driving unit comprises:
   a first pull-up driving unit configured to generate the first pull-up voltage when a first pull-up driving signal is activated in an overdriving period and the post-overdriving period;
   a second pull-up driving unit configured to supply the pull-up power line with a second pull-up voltage lower than the first pull-up voltage when a second pull-up driving signal is activated in the active period; and
   a pull-down driving unit configured to supply the pull-down voltage when the pull-down driving signal is activated in the overdriving period and the post-overdriving period.

8. The sense amplifier driving device of claim 1, wherein the delay unit delays a falling edge of the pull-down pre-signal in a precharge period.

9. The sense amplifier driving device of claim 1, wherein the selection unit selects the output of the delay unit when the post-overdriving enable signal is activated and selects the pull-down pre-signal when the post-overdriving enable signal is deactivated.

10. The sense amplifier driving device of claim 1, wherein the driving signal generation unit is configured to:
    delay a falling edge of a pull-down control signal during a delay time of the delay unit when the post-overdriving enable signal is activated, and
    deactivate the pull-down control signal in response to the pull-down pre-signal when the post-overdriving enable signal is deactivated in the precharge period.

11. A semiconductor device, comprising:
    a sense amplifier configured to sense and amplify data of a memory cell in response to a voltage applied to a pull-up power line and a pull-down power line; and
    a sense amplifier driving device configured to supply a first pull-up voltage and a pull-down voltage to the pull-up power line and the pull-down power line during a post-overdriving period, generate a pull-up driving signal and a pull-down driving signal for controlling the first pull-up voltage and the pull-down voltage, and control a point of time at which the pull-down driving signal shifts in response to a post-overdriving enable signal, wherein the driving signal generation unit comprises:
a control signal generation unit configured to perform pull-up or pull-down driving on a pull-down pre-signal in response to an active signal and a precharge signal;
a delay unit configured to delay the pull-down pre-signal;
a selection unit configured to select one of the pull-down pre-signal and output of the delay unit in response to the post-overdriving enable signal; and
a driving unit configured to output the pull-down driving signal by driving the output of the selection unit.

12. The semiconductor device of claim 11, wherein the post-overdriving period is a certain period of before a word line of a memory cell is disabled prior to a precharge period.

13. The semiconductor device of claim 11, wherein the sense amplifier driving device comprises:
a power driving unit configured to supply the first pull-up voltage and the pull-down voltage to the pull-up power line and the pull-down power line during the post-overdriving period; and
a driving signal generation unit configured to generate the first pull-up driving signal and the pull-down driving signal in order to control a driving of the power driving unit and control the point of time at which the pull-down driving signal shifts in response to the post-overdriving enable signal.

14. The semiconductor device of claim 13, wherein the power driving unit comprises:

a first pull-up driving unit configured to generate the first pull-up voltage when a first pull-up driving signal is activated in an overdriving period and the post-overdriving period;
a second pull-up driving unit configured to supply the pull-up power line with a second pull-up voltage lower than the first pull-up voltage when a second pull-up driving signal is activated in the active period; and
a pull-down driving unit configured to supply the pull-down voltage when the pull-down driving signal is activated in the overdriving period and the post-overdriving period.

15. The semiconductor device of claim 11, wherein the delay unit delays a falling edge of the pull-down pre-signal in a precharge period.

16. The semiconductor device of claim 11, wherein the selection unit selects the output of the delay unit when the post-overdriving enable signal is activated and selects the pull-down pre-signal when the post-overdriving enable signal is deactivated.

17. The semiconductor device of claim 11, wherein the driving signal generation unit is configured to:
delay a falling edge of a pull-down control signal during a delay time of the delay unit when the post-overdriving enable signal is activated, and
deactivate the pull-down control signal in response to the pull-down pre-signal when the post-overdriving enable signal is deactivated in the precharge period.

18. The semiconductor device of claim 11, wherein:
the first pull-up voltage comprises a power supply voltage, and
the pull-down voltage comprises a ground voltage.

* * * * *